United States Patent
Ishida

(10) Patent No.: US 7,491,445 B2
(45) Date of Patent: Feb. 17, 2009

(54) ELECTROCONDUCTIVE FINE PARTICLE AND ANISOTROPICALLY ELECTROCONDUCTIVE MATERIAL COMPRISING NON-CRYSTAL AND CRYSTAL NICKEL PLATING LAYERS AND METHOD OF MAKING THEREOF

(75) Inventor: Hiroya Ishida, Koka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 201 days.

(21) Appl. No.: 10/590,861

(22) PCT Filed: Sep. 1, 2005

(86) PCT No.: PCT/JP2005/015994

§ 371 (c)(1), (2), (4) Date: Jan. 23, 2007

(87) PCT Pub. No.: WO2006/025485

PCT Pub. Date: Mar. 9, 2006

(65) Prior Publication Data

US 2007/0190349 A1 Aug. 16, 2007

(30) Foreign Application Priority Data

Sep. 2, 2004 (JP) .............................. 2004-255928

(51) Int. Cl.
*B32B 5/16* (2006.01)
*B05D 5/00* (2006.01)

(52) U.S. Cl. ........................ 428/403; 427/214; 427/217; 427/258; 427/261; 427/267; 252/512; 428/570

(58) Field of Classification Search ................. 427/214, 427/217, 258, 261, 267; 428/403, 570; 252/512
See application file for complete search history.

(56) References Cited

U.S. PATENT DOCUMENTS

| | | | | |
|---|---|---|---|---|
| 5,306,334 A | * | 4/1994 | Martyak et al. | 106/1.22 |
| 6,770,369 B1 | * | 8/2004 | Oyamada et al. | 428/403 |
| 7,291,393 B2 | * | 11/2007 | Wakiya et al. | 428/403 |
| 7,410,698 B2 | * | 8/2008 | Ishida et al. | 428/403 |
| 2005/0227073 A1 | * | 10/2005 | Oyamada et al. | 428/403 |
| 2006/0073335 A1 | * | 4/2006 | Oyamada et al. | 428/403 |
| 2007/0269603 A1 | * | 11/2007 | Kubota | 427/304 |

FOREIGN PATENT DOCUMENTS

| | | |
|---|---|---|
| JP | 63-190204 | 8/1988 |
| JP | 2-90660 A | 3/1990 |
| JP | 9-13166 A | 1/1997 |
| JP | 9-176827 A | 7/1997 |
| JP | 2000-195339 * | 7/2000 |
| JP | 2003-234020 * | 8/2003 |

* cited by examiner

*Primary Examiner*—H. T Le
(74) *Attorney, Agent, or Firm*—Sughrue Mion, PLLC

(57) ABSTRACT

It is the object of the present invention to provide a conductive particle which has excellent adhesion between a base particle and a conductive layer, a conductive layer being resistant to breaking, impact resistance being improved, and an anisotropic conductive material using the conductive particle. The prevent invention is a conductive particle, which comprises a base particle and a conductive layer formed on a surface of said base particle, said conductive layer having a non-crystal nickel plating layer in contact with the surface of said base particle and a crystal nickel plating layer, and a proportion of a nickel crystal grain aggregate oriented in a nickel (111) plane derived from an integrated intensity ratio in X-ray diffraction measurement being 80% or more.

20 Claims, No Drawings

ELECTROCONDUCTIVE FINE PARTICLE AND ANISOTROPICALLY ELECTROCONDUCTIVE MATERIAL COMPRISING NON-CRYSTAL AND CRYSTAL NICKEL PLATING LAYERS AND METHOD OF MAKING THEREOF

TECHNICAL FIELD

The present invention relates to a conductive particle which has excellent adhesion between a base particle and a conductive layer, a conductive layer being resistant to breaking, impact resistance being improved, and an anisotropic conductive material using the conductive particle.

BACKGROUND ART

Conductive particles are widely used for anisotropic conductive materials such as anisotropic conductive paste, anisotropic conductive ink, an anisotropic conductive pressure sensitive adhesive/an anisotropic conductive adhesive, an anisotropic conductive film and an anisotropic conductive sheet by mixing them with a binder resin or a pressure sensitive adhesive/an adhesive and kneading.

These anisotropic conductive materials are used in the form that they are interposed between opposed boards or between opposed electrode terminals of electronic devices such as a liquid crystal display, a personal computer and a mobile telephone in order to electrically connect a board to another board or to electrically connect a small part such as a semiconductor device to a board.

As these conductive particles, there is disclosed the conductive particle in which a metal plating layer is formed as a conductive film on the surface of a nonconductive particle such as a resin particle having a uniform particle diameter and moderate strength (for example, in Patent Document 1).

In the conductive particle disclosed in Patent Document 1, a nickel plating coating is formed as a conductive film but a phosphorus concentration in the process of forming the nickel plating coating becomes low. In such a nickel plating coating having a low phosphorus concentration, a nickel plating coating having a crystal structure is formed. Since such a nickel plating coating is hard and has an inadequate property to follow the impact, there was a problem that the nickel plating coating might break and the adhesion between a base particle and the nickel plating coating was not good.

For these problems, a conductive particle having a nickel coating comprising a first layer in which a crystal grain aggregate is not found on the surface of the base particle and a second layer in which a crystal grain aggregate is oriented in the direction of thickness is disclosed in Patent Document 2. In this conductive particle, the first layer plays a role of enhancing the adhesion between the base particle and the nickel coating and further enhancing the impact resistance of the conductive particle and the second layer plays a role of improving the conductivity of the conductive particle.

However, it cannot be said that the production method disclosed in Patent Document 2 shows adequate performance in order to produce the conductive particle of a level required as electronic devices have been sharply progressing and developing in recent years, and therefore the need for producing a higher-performance conductive particle by a more strict production method has arisen.

Patent Document 1: Japanese Kokai Publication Sho-63-190204
Patent Document 2: Japanese Kokai Publication 2004-197160

DISCLOSURE OF THE INVENTION

Problems which the Invention is to Solve

In view of the state of the art, it is an object of the present invention to provide a conductive particle which has excellent adhesion between a base particle and a conductive layer, a conductive layer being resistant to breaking, impact resistance being improved, and an anisotropic conductive material using the conductive particle.

Means for Solving the Object

The present invention relates to a conductive particle, which comprises a base particle and a conductive layer formed on a surface of said base particle, said conductive layer having a non-crystal nickel plating layer in contact with the surface of said base particle and a crystal nickel plating layer, and a proportion of a nickel crystal grain aggregate oriented in a nickel (111) plane derived from an integrated intensity ratio in X-ray diffraction measurement being 80% or more.

Hereinafter, the present invention will be described in detail.

The present inventors made earnest investigations, and consequently found that by forming the conductive layer, having a non-crystal nickel plating layer and a crystal nickel plating layer obtained by strictly adjusting a pH during a nickel plating reaction, on the surface of the base particle, a non-crystal nickel plating layer having excellent adhesion between a base particle and a conductive layer and a crystal nickel plating layer in which the proportion of a nickel crystal grain aggregate oriented in a nickel (111) plane is very as high as 80% or more are obtained, and therefore a conductive particle having excellent adhesion between a base particle and a conductive layer and further having excellent conductivity and excellent impact resistance can be obtained, and have completed the present invention.

Hereinafter, the present invention will be described in detail.

A conductive particle of the present invention comprises a base particle and a conductive layer formed on a surface of the base particle.

The base particle is not particularly limited and it may be an inorganic material or organic material as long as it has a moderate elastic modulus, an elastic deformation property and a restitution property, but it is preferably a resin particle comprising a resin since it is easy to control the moderate elastic modulus, the elastic deformation property and the restitution property.

The resin particle is not particularly limited and includes, for example, resin particles comprising polyolefins such as polyethylene, polypropylene, polystyrene, polyvinyl chloride, polyvinylidene chloride, polytetrafluoroethylene, polyisobutylene and polybutadiene; acrylic resins such as polymethyl methacrylate and polymethyl acrylate; divinylbenzene polymer; divinylbenzene type copolymer such as divinylbenzene-styrene copolymer, divinylbenzene-acrylate copolymer and divinylbenzene-methacrylate copolymer; polyalkylene terephthalate, polysulfone, polycarbonate, polyamide, phenol-formaldehyde resin, melamine-formaldehyde resin, benzoguanamine-formaldehyde resin and urea-formaldehyde resin. These resin particles may be used alone or in combination of two or more species.

An average particle diameter of the base particles is not particularly limited but a preferred lower limit of the average particle diameter is 1 μm and a preferred upper limit is 20 μm. When it is less than 1 μm, the base particles may be apt to agglomerate and hard to become a single particle, for example, in electroless plating, and if it is more than 20 μm, it may be out of bounds within which the base particles are used as an anisotropic conductive material between board electrodes and the like. A more preferred upper limit is 10 μm.

The conductive layer has the non-crystal nickel plating layer in contact with a surface of the base particle and the crystal nickel plating layer.

In the conductive particle of the present invention, by having the non-crystal nickel plating layer in contact with the surface of the base particle, the adhesion between the base particle and the conductive layer is enhanced, and the conductive layer is resistant to breaking, and the conductive particle having improved impact resistance can be obtained. Also, by having the crystal nickel plating layer, the conductive particle having excellent conductivity can be obtained.

A preferred lower limit of the phosphorus content of the non-crystal nickel plating layer is 10% and a preferred upper limit is 18%. If it is less than 10%, the non-crystal nickel plating layer becomes too hard and may become apt to break, and if it is more than 18%, the non-crystal nickel plating layer becomes too soft and the adhesion between a base particle and a conductive layer may be deteriorated.

A preferred lower limit of the phosphorus content of the crystal nickel plating layer is 1% and a preferred upper limit is 8%. If it is less than 1%, the crystal nickel plating layer becomes too hard and may become apt to break, and if it is more than 8%, the crystal nickel plating layer becomes too soft and it may be impossible to exert adequate performance as a conductive particle.

The conductive particle of the present invention may have the non-crystal nickel plating layer and the crystal nickel plating layer as the conductive layer. That is, the conductive layer may have a two-layer structure comprising the non-crystal nickel plating layer and the crystal nickel plating layer or may have a three-layer or more structure having the non-crystal nickel plating layer, the crystal nickel plating layer and another layers, but the two-layer structure comprising the non-crystal nickel plating layer and the crystal nickel plating layer is preferred because of easy preparation of the plating layer.

When the three-layer or more structure described above is formed, it is preferred that the another layers contain, for example, gold, silver, copper, platinum, zinc, iron, lead, tin, aluminum, cobalt, indium, chrome, titanium, bismuth, germanium and cadmium; and alloys composed of two or more species of metals such as tin-lead alloy, tin-copper alloy, tin-silver alloy and tin-lead-silver alloy for the purpose of improving conductivity. And, when the another layers are formed, they may be formed by publicly known methods such as electroless plating, electroplating and sputtering.

A film thickness of the non-crystal nickel plating layer is not particularly limited but a preferred lower limit is 10 nm and a preferred upper limit is 100 nm.

A film thickness of the crystal nickel plating layer is not particularly limited but a preferred lower limit is 100 nm and a preferred upper limit is 400 nm.

And, since the film thickness of the non-crystal nickel plating layer has a large effect on the adhesion to the base particle and the thickness of the crystal nickel plating layer has a large effect on the conductivity, the proportion between film thicknesses of the respective layers become important, and the film thickness of the non-crystal nickel plating layer is preferably $1/20$ to $1/5$ of the thickness of the crystal nickel plating layer.

A film thickness of the conductive layer is not particularly limited but a preferred lower limit is 110 nm and a preferred upper limit is 500 nm. If it is less than 110 nm, it may be impossible to attain desired conductivity, and if it is more than 500 nm, the conductive layer becomes apt to peel off from the base particle.

When the conductive particle of the present invention is produced, it is preferred to add a plating stabilizer to the nickel plating solution as described later. As a plating stabilizer, publicly known lead nitrate can be used but bismuth nitrate and/or thallium nitrate and the like is preferably used in consideration of environmental influences and the like, and as a result, the conductive layer preferably contains bismuth and/or thallium in an amount of 1000 ppm or less.

In the conductive particle of the present invention, the conductive layer may have a projection on the surface thereof. By having the projections on its surface, connection resistance can be expected to be reduced because when the conductive particle of the present invention is used for pressure bonding a circuit board and the like, the projections can push through an oxide coating on the surface of the circuit board and the like.

The aspect of the projection is not particularly limited, and if the projection has such hardness that when the conductive particle of the present invention is interposed between circuit boards and circuit boards are pressure bonded conductively, the projection pushes through a binder resin between the conductive particle and the circuit board and is crushed to the extent that the projection can come into surface-contact with the circuit board and the like, and the aspect of the projection is not particularly limited and includes, for example, projections having the core material of a conductive material such as metals, oxides of metals, conductive nonmetals such as graphite, and conductive polymers such as polyacetylene. Among others, metals are preferably used since they have high conductivity.

The metal is not particularly limited and includes, for example, metals such as gold, silver, copper, platinum, zinc, iron, lead, tin, aluminum, cobalt, indium, nickel, chrome, titanium, antimony, bismuth, germanium and cadmium; and alloys composed of two or more species of metals such as tin-lead alloy, tin-copper alloy, tin-silver alloy and tin-lead-silver alloy. Among others, nickel, copper, silver and gold are preferred.

The shape of the core material is not particularly limited, but it is preferably in the form of aggregate or a particle. A substance having a shape in aggregate form includes, for example, aggregate in particle form, agglomerated aggregate obtained by agglomeration of a plurality of particles and aggregate in infinite form. A substance having a shape in particle form includes, for example, spherical, disciform, columniform, plate form, acicular form, cubic form or rectangular parallelepiped form.

When the core material is in the form of a particle, it is preferred that 80% or more of the core material is in contact with the base particle or is in a distance of 5 nm or less from the base particle.

By being in contact with the base particle or existing at a position close to the base particle, the core material will be surely covered with the conductive layer and the conductive particle and therefore, the conductive particle having the excellent adhesion of the projection to the base particle can be attained. Further, with respect to the core material, by being in contact with the base particle or existing at a position close to the base particle, projections can be aligned to the surface of the base particle. And, it becomes possible to attain a conductive particle in which the sizes of the core material can be easily aligned and the heights of the projections are aligned on the surface of the base particle.

Therefore, when electrodes, in which the conductive particle of the present invention are used as an anisotropic conductive material, are connected to each other, it is possible to attain an effect of reducing the variations of conduction performance of the conductive particle and having excellent conduction reliability.

An average height of the projections is not particularly limited but a preferred lower limit is 0.5% of a particle diameter of the base particle and a preferred upper limit is 25% of a particle diameter of the base particle. If it is less than 0.5%, it may be impossible to attain an adequate property of displacing resin, and if it is more than 25%, the projection may deeply dig into the circuit board and the like to break the circuit board and the like. A more preferred lower limit is 10% of a particle diameter of the base particle and a more preferred upper limit is 17% of a particle diameter of the base particle.

Further, the average height of the projections is determined by measuring heights of 50 convex parts, which are selected at random, existing on the conductive layer and averaging measured heights arithmetically. In determining the average height, a convex part having a height of 10 nm or more above the conductive layer is selected as a projection, such a convex part being deemed to have the effect of having a projection.

When the conductive particle of the present invention has the projection, the core material may be deposited on the surface of the base particle. A method of depositing the core material is not particularly limited and includes, for example, a method in which the conductive material to become a core material is added to a dispersion of the base particle and the core materials are collected and deposited on the surface of the base particle by, for example, van der Waals forces; and a method in which the conductive material to become a core material is added to a container of the base particle and the core material is deposited on the surface of the base particle by mechanical actions through the rotation of the container and the like. Among others, the method of collecting and depositing the core material on the surface of the base particle in dispersion is suitably used because an amount of the core material to be deposited is easily controllable.

As for the method of collecting and depositing the core material on the surface of the base particle in a dispersion, more specifically, it is preferred to use the core material having a particle diameter of 0.5 to 25% with respect to an average particle diameter of the base particles. More preferably, it is 1.5 to 15%. In consideration of the dispersibility of the core material in a dispersion medium, it is preferred that the specific gravity of the core material is as small as possible. Further, it is preferred to use deionized water as a dispersion medium in order not to change significantly the surface charge of the base particle and the core material. A cationic surfactant may be used for the purpose of improving the dispersibility.

In the conductive particle of the present invention, it is preferred that a gold layer is further formed on the surface of the conductive layer. By providing the gold layer for the surface of the conductive layer, it is possible to prevent the oxidation of the conductive layer, reduce the connection resistance and stabilize the surface.

A method of forming the gold layer is not particularly limited and includes publicly known methods such as electroless plating, displacement plating, electroplating, reduction plating and sputtering.

A film thickness of the gold layer is not particularly limited but a preferred lower limit of the film thickness is 1 nm and a preferred upper limit is 100 nm. If it is less than 1 nm, the prevention of oxidation of the conductive layer may become difficult and the connection resistance may be increased, and if it is more than 100 nm, the gold layer may erode the conductive layer and the adhesion between the base particle and the conductive layer may deteriorate.

In the conductive particle of the present invention, a preferred lower limit of the film thickness of the conductive layer or the gold layer which covers the surface of the base particle is 110 nm and a preferred upper limit is 600 nm. If it is less than 110 nm, it may be impossible to attain desired conductivity, and if it is more than 600 nm, the adhesion between the base particle and the conductive layer may deteriorate.

In the conductive particle of the present invention, it is possible to determine whether each layer of the conductive layer is the non-crystal nickel plating layer or the crystal nickel plating layer by X-ray diffraction measurement of the conductive layer.

A nickel crystal grain aggregate contained in the conductive layer is identified by the X-ray diffraction measurement, for example, a diffraction peak of each lattice plane such as a nickel (111) plane, a nickel (200) plane, a nickel (220) plane and the like. And, a proportion of each lattice plane can be determined by an integrated intensity ratio of a diffraction peak of each lattice plane.

In the conductive particle of the present invention, the proportion of the nickel crystal grain aggregate oriented in a nickel (111) plane derived from an integrated intensity ratio in X-ray diffraction measurement is 80% or more.

In the present invention, since the conductive layer is formed on the surface of the base particle by a strict pH control as described later, it is possible to obtain a conductive layer having a nickel crystal grain aggregate content in high proportion which could not be attained conventionally and therefore it is possible to obtain a conductive particle having excellent conductivity.

In producing the conductive particle of the present invention, plating may be performed in the order in which the non-crystal nickel plating layer is formed on the surface of the base particle and then the crystal nickel plating layer is formed. As methods of forming the non-crystal nickel plating layer or the crystal nickel plating layer, for example, a method of controlling a pH of a plating reaction, a method of controlling a phosphorus concentration of a nickel plating solution and the like can be used. Among others, the method of controlling a pH of a plating reaction is suitably used because of excellent control of a reaction.

Specifically, the conductive particle of the present invention can be produced, for example, by a method of producing the conductive particle, comprising: a step 1 of providing a catalyst for the surface of the base particle; a step 2 of using a nickel plating solution containing at least one complexing agent selected from the group consisting of citric acid, malic acid, succinic acid, propionic acid, lactic acid and acetic acid, and salts thereof and forming the non-crystal nickel plating layer on the surface of said base particle by adjusting a pH to 4.9 or less in a nickel plating reaction; and a step 3 of using a nickel plating solution containing at least one complexing agent selected from the group consisting of citric acid, malic acid, succinic acid, propionic acid, lactic acid and acetic acid, and salts thereof and forming the crystal nickel plating layer by adjusting a pH to 7.2 to 9 in a nickel plating reaction.

Such a method of producing the conductive particle also constitutes the present invention.

Hereinafter, the respective steps will be described in detail.

The method of producing the conductive particle of the present invention has the step 1 of providing a catalyst for the surface of the base particle.

The method of providing a catalyst includes, for example, a method in which the base particles etched with an alkali solution were subjected to acid neutralization and sensitization in a tin dichloride ($SnCl_2$) solution, and subjected to an electroless plating pretreatment step in which activating in a palladium dichloride ($PdCl_2$) solution is performed.

Incidentally, sensitization is a step in which $Sn^{2+}$ ion is adsorbed on the surface of an insulating material and activating is a step of initiating a reaction represented by a chemical equation, $Sn^{2+}+Pd^{2+}\rightarrow Sn^{4+}Pd^0$, on the surface of an insulating material to form palladium as a catalyst nucleus of electroless plating.

The method of producing the conductive particle of the present invention has the step 2 of using a nickel plating solution containing at least one complexing agent selected from the group consisting of citric acid, malic acid, succinic acid, propionic acid, lactic acid and acetic acid, and salts thereof and forming the non-crystal nickel plating layer on the surface of the base particle by adjusting a pH to 4.9 or less in a nickel plating reaction.

As a method of forming the non-crystal nickel plating layer, a method of adjusting a pH to 4.9 or less in a nickel plating reaction is preferred and specifically, for example, a method 1 of adjusting a pH of the nickel plating solution and a pH of a reaction bath to 4.5, respectively, and a pH in the nickel plating reaction to 4.5, and a method 2 of adjusting a pH of the nickel plating solution to 8 and a pH of the reaction bath to 4, and setting a rate of dropwise addition of the nickel plating solution to ⅓ of that in the method 1, and adjusting a pH in the nickel plating reaction to 4.5. In the present invention, by adjusting a pH to 4.9 or less in a nickel plating reaction in forming the non-crystal nickel plating layer, the adhesion between the base particle and the non-crystal nickel plating layer becomes excellent and the whole conductive particle becomes superior in impact resistance.

The nickel plating solution in forming the non-crystal nickel plating layer preferably contains at least one complexing agent selected from the group consisting of citric acid, malic acid, succinic acid, propionic acid, lactic acid and acetic acid, and salts thereof. By containing such a complexing agent and performing a nickel plating reaction at a pH described above, a non-crystal nickel plating layer in which a crystal grain aggregate is not recognized can be prepared with efficiency.

And, the nickel plating solution preferably contains bismuth nitrate and/or thallium nitrate as a plating stabilizer.

The method of producing the conductive particle of the present invention has the step 3 of using a nickel plating solution containing at least one complexing agent selected from the group consisting of citric acid, malic acid, succinic acid, propionic acid, lactic acid and acetic acid, and salts thereof and forming the crystal nickel plating layer by adjusting a pH to 7.2 to 9 in a nickel plating reaction.

As a method of forming the crystal nickel plating layer, a method of adjusting a pH of a nickel plating reaction to 7.2 to 9 is preferred and specifically, for example, a method of adjusting a pH of the nickel plating solution to 10.5, a pH of the reaction bath to 6.2, and a pH in the nickel plating reaction to 7.8 can be used.

The nickel plating solution in forming the crystal nickel plating layer preferably contains at least one complexing agent selected from the group consisting of citric acid, malic acid, succinic acid, propionic acid, lactic acid and acetic acid, and salts thereof. By containing such a complexing agent and performing a nickel plating reaction at a pH described above, a crystal nickel plating layer, in which the proportion of a nickel crystal grain aggregate oriented in a nickel (111) plane is 80% or more, having a high nickel crystal grain aggregate content which could not be attained conventionally, can be prepared with efficiency.

And, the nickel plating solution preferably contains bismuth nitrate and/or thallium nitrate as a plating stabilizer.

An anisotropic conductive material can be produced by dispersing the conductive particles of the present invention in a binder resin. Such an anisotropic conductive material also constitutes the present invention.

A specific example of the anisotropic conductive material of the present invention includes, for example, anisotropic conductive paste, anisotropic conductive ink, an anisotropic conductive pressure sensitive adhesive layer, an anisotropic conductive film and an anisotropic conductive sheet.

The resin binder is not particularly limited but insulative resins are used, and for example, vinyl type resins such as vinyl acetate type resin, vinyl chloride type resin, acrylic type resin and styrenic type resin; thermoplastic resins such as polyolefin type resin, ethylene-vinyl acetate type copolymer and polyamide type resin; curable resins such as epoxy type resin, urethane type resin, polyimide type resin, unsaturated polyester type resin and curing agents thereof; thermoplastic block copolymer such as styrene-butadiene-styrene block copolymer, styrene-isoprene-styrene block copolymer and hydrogenated compounds thereof; and elastomers (rubbers) such as styrene-butadiene copolymer rubber, chloroprene rubber and acrylonitrile-styrene block copolymer rubber. These resins may be used alone or in combination of two or more species.

And, the curable resin may be any curing type of room temperature setting type, thermosetting type, photocuring type and moisture curing type.

To the anisotropic conductive material of the present invention, various additives such as a filler, a softening agent (a plasticizer), a pressure sensitive adhesive/adhesive improver, an antioxidant (an age resister), a heat stabilizer, a light stabilizer, an ultraviolet absorber, a coloring agent, a flame retardant and an organic solvent may be added other than the conductive particle of the present invention and the resin binder, to the extent of not interfering the attainment of the object of the present invention as required.

A method of producing the anisotropic conductive material of the present invention is not particularly limited and includes, for example, a method in which the conductive particle of the present invention is added to an insulative resin binder and this mixture is uniformly mixed to disperse the particles to form, for example, anisotropic conductive paste, anisotropic conductive ink, an anisotropic conductive pressure sensitive adhesive/an anisotropic conductive adhesive and the like, and a method in which the conductive particle of the present invention is added to an insulative resin binder and this mixture is uniformly dissolved (dispersed), or melted by heating and the resulting solution (dispersion) is applied to the face subjected to releasing treatment of release materials such as a release paper and a release film so as to form a prescribed film thickness and dried or cooled as required to form, for example, an anisotropic conductive film, an anisotropic conductive sheet and the like, and as the method of producing the anisotropic conductive material of the present invention, an appropriate method may selected from these methods may be employed in accordance with the species of the anisotropic conductive material to be prepared.

And, the anisotropic conductive material may be formed by not mixing but using separately the insulative resin binder and the conductive particle of the present invention.

Effect of the Invention

In accordance with the present invention, by forming the conductive layer, having a non-crystal nickel plating layer and a crystal nickel plating layer which are obtained by strictly adjusting a pH in a nickel plating reaction, on the surface of the base particle, a non-crystal nickel plating layer having excellent adhesion between a base particle and a conductive layer and a crystal nickel plating layer in which the proportion of a nickel crystal grain aggregate oriented in a nickel (111) plane is very as high as 80% or more are obtained, and therefore a conductive particle having excellent adhesion between a base particle and a conductive layer and further having excellent conductivity and excellent impact resistance can be obtained.

In accordance with the present invention, it is capable of providing a conductive particle which has excellent adhesion between a base particle and a conductive layer, a conductive layer being resistant to breaking, impact resistance being improved, and an anisotropic conductive material using the conductive particle.

BEST MODE FOR CARRYING OUT THE INVENTION

Hereinafter, the present invention will be described in more detail by way of examples, but the present invention is not limited to these examples.

EXAMPLE 1

10 g of base particles having an average particle diameter of 3 μm comprising a divinylbenzene copolymer ("SP-203" produced by Sekisui Chemical Co., Ltd.) were subjected to alkali degreasing and acid neutralization by an aqueous solution of sodium hydroxide and sensitization in a tin dichloride solution. Then, the base particles were subjected to electroless plating pretreatment comprising activating in a palladium dichloride solution and filtered and cleaned to obtain base particles, the surface of which palladium was deposited on.

The obtained base particles were further diluted with 1200 mL of water, and to this, 4 mL of a 1 g/L aqueous solution of thallium nitrate was added as a plating stabilizer to form an aqueous solution, and 120 mL of a mixed solution obtained by mixing 450 g/L of nickel sulfate, 150 g/L of sodium hypophosphite, 116 g/L of sodium citrate (complexing agent) and 6 mL of a 1 g/L aqueous solution of thallium nitrate as a plating stabilizer was adjusted to pH 4.5 with 10% sulfuric acid to obtain a nickel plating solution, and this nickel plating solution was added to the aqueous solution of the base particle prepared above in a reaction bath at an addition rate of 81 mL/minute through a metering pump. Then, the resulting mixture was stirred until a pH is stabilized and after confirming that a pH in a nickel plating reaction was 4.5, a halt on the formation of hydrogen foam was confirmed and an early step of electroless plating process was performed and a nickel plated particle 1 was obtained.

The obtained nickel plated particle 1 was sampled and dried and X-ray diffraction measurement of the nickel plating coating was performed. The X-ray diffraction measurement was performed under the measuring conditions of a tube voltage: 50 kV, a tube current: 100 mA, X-ray: CuKα line, and a wavelength λ: 1.541 angstroms using "X-RAY DIFFRACTO METER RINT 1400" manufactured by Rigaku Corporation. As the result of X-ray diffraction measurement, a peak of a nickel crystal could not be identified and therefore it was confirmed that it was a non-crystal nickel plating layer.

Next, further, 650 mL of a mixed solution obtained by mixing 450 g/L of nickel sulfate, 150 g/L of sodium hypophosphite, 116 g/L of sodium citrate (complexing agent) and 35 mL of a 1 g/L aqueous solution of thallium nitrate as a plating stabilizer, was adjusted to pH 10.5 with ammonia water to form a nickel plating solution and this nickel plating solution was added at an addition rate of 27 mL/minute through a metering pump. Then, the resulting mixture was stirred until a pH is stabilized and after confirming that a pH in a nickel plating reaction was 7.8, a halt on the formation of hydrogen foam was confirmed and a later step of electroless plating process was performed to obtain a nickel plated particle 2.

The obtained nickel plated particle 2 was sampled and dried and X-ray diffraction measurement of the nickel plating coating was performed in the same manner as the nickel plated particle 1. As the result of X-ray diffraction measurement, a peak of a nickel crystal was identified and therefore a nickel (111) plane was observed at the position of $2\theta=44.9°$, a nickel (200) plane was observed at the position of $2\theta=51.5°$ and a nickel (220) plane was observed at the position of $2\theta=76.7°$. And, it was verified that an integrated intensity ratio of the respective peaks was (111) plane:(200) plane:(220) plane=86:8:6, and it was verified that as for a nickel crystal, the proportion of a nickel crystal grain aggregate oriented in a (111) plane was 86%. That is, it was confirmed that the proportion derived from an integrated intensity ratio of the nickel (111) plane was 80% or more.

Next, the nickel plating solution was filtered, and substances filtered was washed with water and then dried with a vacuum drier of 80° C. and further the surface was goldplated by displacement plating to obtain a gold-plated conductive particle.

COMPARATIVE EXAMPLE 1

A base particle was prepared and an electroless plating pretreatment step was performed in the same manner as in Example 1.

A nickel plated particle 3 was obtained by following the same manner as in Example 1 except that 120 mL of a mixed solution obtained by mixing 170 g/L of nickel sulfate, 170 g/L of sodium hypophosphite, 340 g/L of sodium pyrophosphate and 6 mL of a 1 g/L aqueous solution of thallium nitrate as a plating stabilizer was adjusted to pH 9.4 with ammonia water to form a nickel plating solution and this nickel plating solution was added to a reaction bath spending 10 minutes through a metering pump and it was confirmed that a pH in a nickel plating reaction was 7.8.

X-ray diffraction measurement of the nickel plating coating of the obtained nickel plated particle 3 was performed in the same manner as in Example 1. As the result of X-ray diffraction measurement, a peak of a nickel crystal was identified and therefore it was confirmed that it was a crystal nickel plating layer.

Next, a gold plating layer was prepared in the same manner as in Example 1 after the later step of electroless plating process to obtain a gold-plated conductive particle.

COMPARATIVE EXAMPLE 2

A base particle was prepared and an electroless plating pretreatment step was performed in the same manner as in Example 1.

An early step of electroless plating process was performed in the same manner as in Example 1 except for adjusting a pH of the nickel plating solution and a pH in the nickel plating reaction to 6.0, respectively, and a nickel plated particle 4 was obtained.

X-ray diffraction measurement of the nickel plating coating of the obtained nickel plated particle 4 was performed in the same manner as in Example 1. As the result of X-ray diffraction measurement, a peak of a nickel crystal could not be identified and therefore it was confirmed that it was a non-crystal nickel plating layer.

Next, a later step of electroless plating process was performed in the same manner as in Example 1 except for adjusting a pH in the nickel plating reaction to 7.8 using glycine as a complexing agent and a nickel plated particle 5 was obtained.

X-ray diffraction measurement of the nickel plating coating of the obtained nickel plated particle 5 was performed in the same manner as in Example 1. As the result of X-ray diffraction measurement, it was verified that as for a nickel crystal, the proportion of a nickel crystal grain aggregate oriented in a (111) plane was 60% and therefore it was confirmed that it was a crystal nickel plating layer.

Next, a gold plating layer was prepared in the same manner as in Example 1 to obtain a gold-plated conductive particle.

<Evaluation>

The conductive particles obtained in Example 1 and Comparative Examples 1, 2 were evaluated as follows. The results are shown in Table 1.

(1) Evaluation of Adhesion of Conductive Particle

With respect to each of conductive particles obtained in Example 1 and Comparative Examples 1, 2, 1 g of the conductive particle, 10 g of zirconia balls of 1 mm in diameter and 20 mL of toluene were charged into a 100 mL beaker and the contents of the beaker was stirred for 3 minutes at a rotation speed of 300 rpm with four stainless steel agitating blades and the conductive particles were pulverized.

The pulverized conductive particles were observed and the number of broken particles among 1000 particles was counted on the SEM photograph (a magnification of 1000 times) obtained a scanning electron microscope (SEM) and thereby the adhesion between a base particle and a plating coating was evaluated. Incidentally, the number of broken particles was determined by counting a conductive particle which has produced a crack or peeling larger than ½ of the diameter of the conductive particle.

(2) Evaluation of Anisotropic Conductive Material 100 parts by weight of epoxy resin (produced by Yuka Shell Epoxy Co., Ltd., "Epikote 828") as a resin for a resin binder, 2 parts by weight of tris(dimethylaminoethyl)phenol and 100 parts by weight of toluene were well mixed using a planetary mixer, and then the resulting mixture was applied onto a release film in such a way that a dried film thickness is 10 μm, and toluene was vaporized to obtain an adhesive film.

Next, to a mixture of 100 parts by weight of epoxy resin (produced by Yuka Shell Epoxy Co., Ltd., "Epikote 828") as a resin for a resin binder, 2 parts by weight of tris(dimethylaminoethyl)phenol and 100 parts by weight of toluene, the obtained conductive particle was added, and this mixture was well mixed with a planetary mixer and then applied onto a release film in such a way that a dried film thickness is 7 μm, and toluene was vaporized to obtain an adhesive film containing the conductive particle. In addition, the conductive particle was added so that the number of the particles in the film is 50000/cm$^2$.

An anisotropic conductive film of 17 μm in thickness, having a two-layer structure, was obtained by laminating the obtained adhesive film and the obtained adhesive film containing the conductive particle at room temperature.

The obtained anisotropic conductive film was cut into a piece having a size of 5 mm×5 mm. This piece was bonded to the about middle of an aluminum electrode having 200 μm wide, 1 mm long and 0.2 μm thick with L/S of 20 μm, having a lead for measuring the resistance on one side, and then, glass substrates having the same aluminum electrode were aligned with each other in such a way that one electrode overlays the other electrode and bonded.

After the joining portions of these glass substrates were bonded to each other by thermocompression under the bonding conditions of 40 MPa and 200° C., a resistance between electrodes and the presence or absence of a leakage current between electrodes were evaluated.

TABLE 1

|  | Example1 | Comparative Example1 | Comparative Example2 |
| --- | --- | --- | --- |
| Proportion of nickel crystal grain aggregate oriented in nickel (111) plane | 86% | — | 60% |
| Number of broken particles among 1000 particles | 0 | 10 | 50 |
| Resistance between electrodes | 10 Ω | 10 Ω | 20 Ω |
| Presence or absence of leakage current between electrodes | absent | absent | absent |

In Example 1, it can be said that since the conductive layer includes a non-crystal nickel plating layer in which sodium citrate was used as a complexing agent, the plating coating is resistant to breaking and the impact resistance is improved even when pulverization treatment is carried out, and since the non-crystal nickel plating layer is formed on the surface of the base particle, the adhesion between a base particle and a conductive layer is excellent.

On the other hand, in Comparative Example 1, it can be said that since the conductive layer does not include a non-crystal nickel plating layer, the plating coating is apt to break, the impact resistance is deteriorated and the adhesion between a base particle and a conductive layer is low when pulverization is carried out.

And, in Comparative Example 2, since glycine is used as a complexing agent, the nickel plating layer is oriented in column form and the plating coating becomes apt to produce cracks longitudinally. Therefore, it can be said that the plating coating is apt to break, the impact resistance is deteriorated and the adhesion between a base particle and a conductive layer is low, when pulverization treatment is carried out.

INDUSTRIAL APPLICABILITY OF THE INVENTION

In accordance with the present invention, it is capable of providing a conductive particle which has excellent adhesion between a base particle and a conductive layer, a conductive layer being resistant to breaking, impact resistance being improved, and an anisotropic conductive material using the conductive particle.

The invention claimed is:
1. A conductive particle,
which comprises a base particle and a conductive layer formed on a surface of said base particle,
said conductive layer having a non-crystal nickel plating layer in contact with the surface of said base particle and a crystal nickel plating layer, and a proportion of a nickel crystal grain aggregate oriented in a nickel (111) plane derived from an integrated intensity ratio in X-ray diffraction measurement being 80% or more.

2. The conductive particle according to claim 1, wherein a phosphorus content of the non-crystal nickel plating layer is 10 to 18% and a phosphorus content of the crystal nickel plating layer is 1 to 8%.

3. The conductive particle according to claim 2, wherein the conductive layer contains bismuth and/or thallium in an amount of 1000 ppm or less.

4. The conductive particle according to claim 2, wherein the conductive layer has a projection on the surface thereof.

5. The conductive particle according to claim 2, wherein a gold layer is further formed on the surface of the conductive layer.

6. A method of producing the conductive particle according to claim 2, comprising:
a step 1 of providing a catalyst for the surface of the base particle;
a step 2 of using a nickel plating solution containing at least one complexing agent selected from the group consisting of citric acid, malic acid, succinic acid, propionic acid, lactic acid and acetic acid, and salts thereof and forming the non-crystal nickel plating layer on the surface of said base particle by adjusting a pH to 4.9 or less in a nickel plating reaction; and
a step 3 of using a nickel plating solution containing at least one complexing agent selected from the group consisting of citric acid, malic acid, succinic acid, propionic acid, lactic acid and acetic acid, and salts thereof and forming the crystal nickel plating layer by adjusting a pH to 7.2 to 9 in a nickel plating reaction.

7. The conductive particle according to claim 1, wherein the conductive layer contains bismuth and/or thallium in an amount of 1000 ppm or less.

8. The conductive particle according to claim 7, wherein the conductive layer has a projection on the surface thereof.

9. The conductive particle according to claim 7, wherein a gold layer is further formed on the surface of the conductive layer.

10. A method of producing the conductive particle according to claim 7, comprising:
a step 1 of providing a catalyst for the surface of the base particle;
a step 2 of using a nickel plating solution containing at least one complexing agent selected from the group consisting of citric acid, malic acid, succinic acid, propionic acid, lactic acid and acetic acid, and salts thereof and forming the non-crystal nickel plating layer on the surface of said base particle by adjusting a pH to 4.9 or less in a nickel plating reaction; and
a step 3 of using a nickel plating solution containing at least one complexing agent selected from the group consisting of citric acid, malic acid, succinic acid, propionic acid, lactic acid and acetic acid, and salts thereof and forming the crystal nickel plating layer by adjusting a pH to 7.2 to 9 in a nickel plating reaction.

11. The conductive particle according to claim 1, wherein the conductive layer has a projection on the surface thereof.

12. The conductive particle according to claim 11, wherein a gold layer is further formed on the surface of the conductive layer.

13. The conductive particle according to claim 11, wherein the projection has a core material.

14. The conductive particle according to claim 13, wherein 80% or more of the core material is in contact with the base particle or is in a distance of 5 nm or less from said base particle.

15. The conductive particle according to claim 14, wherein a gold layer is further formed on the surface of the conductive layer.

16. The conductive particle according to claim 13, wherein a gold layer is further formed on the surface of the conductive layer.

17. A method of producing the conductive particle according to claim 11, comprising:
a step 1 of providing a catalyst for the surface of the base particle;
a step 2 of using a nickel plating solution containing at least one complexing agent selected from the group consisting of citric acid, malic acid, succinic acid, propionic acid, lactic acid and acetic acid, and salts thereof and forming the non-crystal nickel plating layer on the surface of said base particle by adjusting a pH to 4.9 or less in a nickel plating reaction; and
a step 3 of using a nickel plating solution containing at least one complexing agent selected from the group consisting of citric acid, malic acid, succinic acid, propionic acid, lactic acid and acetic acid, and salts thereof and forming the crystal nickel plating layer by adjusting a pH to 7.2 to 9 in a nickel plating reaction.

18. The conductive particle according to claim 1, wherein a gold layer is further formed on the surface of the conductive layer.

19. A method of producing the conductive particle according to claim 1, comprising:
a step 1 of providing a catalyst for the surface of the base particle;
a step 2 of using a nickel plating solution containing at least one complexing agent selected from the group consisting of citric acid, malic acid, succinic acid, propionic acid, lactic acid and acetic acid, and salts thereof and forming the non-crystal nickel plating layer on the surface of said base particle by adjusting a pH to 4.9 or less in a nickel plating reaction; and
a step 3 of using a nickel plating solution containing at least one complexing agent selected from the group consisting of citric acid, malic acid, succinic acid, propionic acid, lactic acid and acetic acid, and salts thereof and forming the crystal nickel plating layer by adjusting a pH to 7.2 to 9 in a nickel plating reaction.

20. An anisotropic conductive material, which is obtained by dispersing the conductive particle according to claim 1, in a resin binder.

* * * * *